US007563713B2

(12) United States Patent
Rowell et al.

(10) Patent No.: US 7,563,713 B2
(45) Date of Patent: Jul. 21, 2009

(54) SEMICONDUCTOR DEVICES HAVING PLATED CONTACTS, AND METHODS OF MANUFACTURING THE SAME

(75) Inventors: Petra V. Rowell, Newbury Park, CA (US); Miguel E. Urteaga, Moorpark, CA (US); Richard L. Pierson, Jr., Thousand Oaks, CA (US); Berinder P. S. Brar, Newbury Park, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 333 days.

(21) Appl. No.: 11/064,535

(22) Filed: Feb. 23, 2005

(65) Prior Publication Data

US 2006/0186543 A1    Aug. 24, 2006

(51) Int. Cl.
*H01L 21/44* (2006.01)
(52) U.S. Cl. ...................................................... 438/674
(58) Field of Classification Search .................. 257/354; 205/50, 123; 430/5; 438/83, 98, 100, 233, 438/399, 533, 571, 666, 674
See application file for complete search history.

(56) References Cited

U.S. PATENT DOCUMENTS 4,586,988 A * 5/1986 Nath et al. .................. 205/123
4,624,749 A * 11/1986 Black et al. .................. 205/50
5,147,740 A * 9/1992 Robinson ........................ 430/5
5,151,168 A    9/1992 Gilton et al. ................. 205/123
6,429,487 B1 * 8/2002 Kunikiyo ..................... 257/354
2002/0020920 A1    2/2002 Farrar

OTHER PUBLICATIONS

Geng, Hwaiyu; "Semiconductor Manufacturing Handbook"; 2005; pp. 16-1-16.11.

* cited by examiner

*Primary Examiner*—Davienne Monbleau
*Assistant Examiner*—Monica D Harrison
(74) *Attorney, Agent, or Firm*—Koppel, Patrick, Heybl & Dawson (57) ABSTRACT

A mask layer is applied to a surface of a semiconductor structure or a seed layer deposited on the surface. The mask layer has a submicron width opening with a high aspect ratio that exposes a portion of the surface or seed layer. Conductive material is conformed to the opening, for example by plating, to form a first contact on the surface or seed layer. The mask and the top layer of the semiconductor structure, except for the portion under the first contact, are removed to expose a second layer of the semiconductor structure. An insulating layer is formed along the sidewalls of the first contact and the top layer of the semiconductor structure beneath the first contact. A mask is then applied to the second layer and a second contact is formed by selectively depositing metal only on the portion of the second layer exposed by the opening.

37 Claims, 8 Drawing Sheets

SEMICONDUCTOR DEVICES HAVING PLATED CONTACTS, AND METHODS OF MANUFACTURING THE SAME

BACKGROUND OF THE INVENTION

1. Field of the Invention

This invention relates to semiconductor devices and more particularly to semiconductor devices having plated contacts, and methods of manufacturing the same.

2. Description of Related Art

Extending the bandwidths of semiconductor devices, such as heterojunction bipolar transistors (HBTs), often requires submicron scaling of the lateral or width dimensions of a semiconductor junction and close positioning, relative to each other, of the electrical contacts to the semiconductor layers that form the junction. Presently, submicron scaling of emitter-base junctions in HBTs is difficult because of the process steps used to fabricate the device. "Submicron" as used herein means less than or equal to approximately 1 micron ($\mu$m).

Two process steps make the formation of a submicron base-emitter junction difficult. They are: 1) the formation of a submicron emitter contact having a high aspect ratio and substantially straight sidewalls relative to the semiconductor surfaces, and 2) the deposition of a base contact that is in close proximity to the emitter contact. Because of alignment tolerances in lithographic processes, self-aligned processes are preferred for depositing contacts in close proximity to one another. "Self-aligned processes" as used herein means processes that rely on only one lithography operation to set the position of one feature relative to another. "Aspect ratio" as used herein means the ratio of emitter contact height to contact width.

Figure 1A:
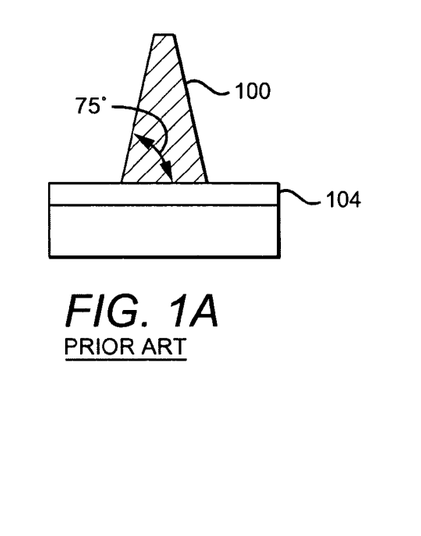
FIGS. 1a and 1b are cross-sections of a prior art semiconductor device contact having tapered sidewalls and an undercut semiconductor layer.
Figure 1B:
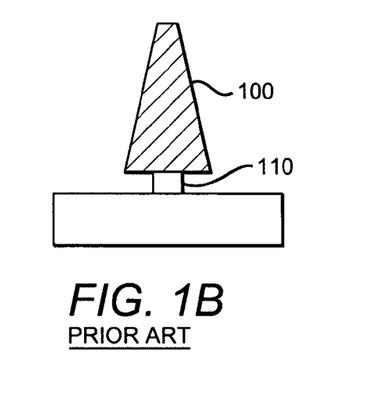

A conventional approach for forming an emitter contact involves electron beam evaporation and liftoff processes. As illustrated in FIGS. 1a and 1b, these processes create an emitter contact 100 with a tapered profile. A standard evaporation process creates an angle of approximately 75 degrees between the sidewall of the contact and the semiconductor surface. This limits the maximum aspect ratio of the contact to approximately 1.75. The tapered profile also provides less area for interconnect metal to contact the emitter.

Figure 2A:
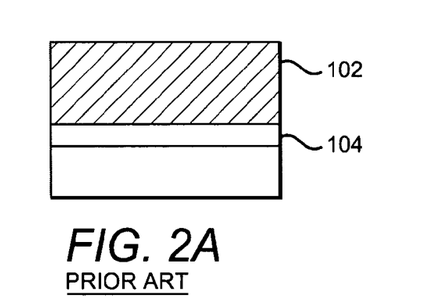
FIGS. 2a, 2b and 2c are cross-sections depicting the formation of a prior art semiconductor device contact having an undercut semiconductor layer.
Figure 2B:
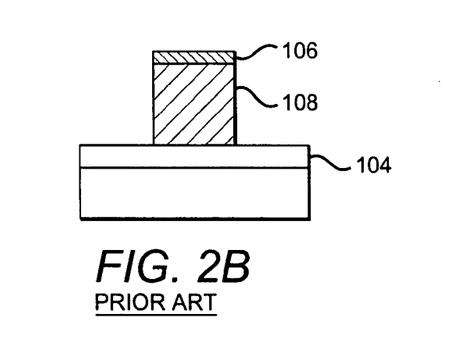

Another approach to forming the emitter contact, as illustrated in FIGS. 2a and 2b is to blanket deposit the emitter metal 102 on the emitter layer 104 of semiconductor material (FIG. 2a). The emitter metal 102 is then patterned with a masking material 106 and etched to leave an emitter contact 108 (FIG. 2b). The etching leaves the emitter contact 108 under the masking material 106. Metal deposition (FIG. 2a) and etch processes (FIG. 2b) suffer from problems such as: metal film stress, etch mask selectivity and etch undercut.

Figure 2C:
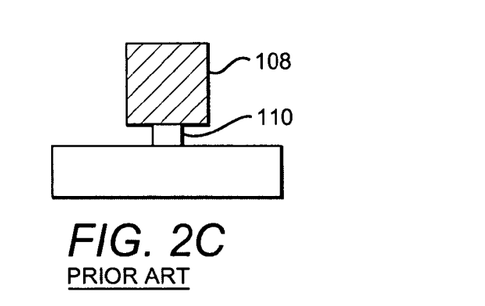

During formation of an HBT, the emitter contact is typically used as an etch mask for a self-aligned etch of the emitter mesa. In this process (FIG. 1b, FIG. 2c), the emitter semiconductor layer 104 is etched away, leaving the emitter contact 100, 108 and the underlying, remaining portion 110 of the emitter layer. Thus, the contact 100, 108 must be scaled to approximately the same dimensions as the emitter-base junction. As illustrated in FIG. 1b and FIG. 2c, the etching may result in a contact 100, 108 that is undercut which, as explained below, impacts device yield.

In one standard fabrication technique, the emitter-contact must be tall (approximately 1 $\mu$m) to allow process margin in the planarization and etch back process used to contact the HBT terminals with the first level of metal interconnect. Therefore, submicron devices require emitter contacts with large aspect ratios. Such dimensions are difficult to realize using standard evaporation and liftoff processes because of the tapered profile (FIGS. 1a and 1b) that is obtained.

To minimize base resistance and base-collector capacitance in the device, the base contact should be placed as close as possible to the emitter contact. In most instances, as the device is scaled down, the base contact to emitter contact separation must also decrease. A non-self-aligned deposition of the base contact is difficult to realize for base-to-emitter contact separations of less than 0.5 $\mu$m. Self-aligned processes are preferred to deposit the base contact in close proximity to the emitter contact.

Figures 3A, 3B, 3C, 5:
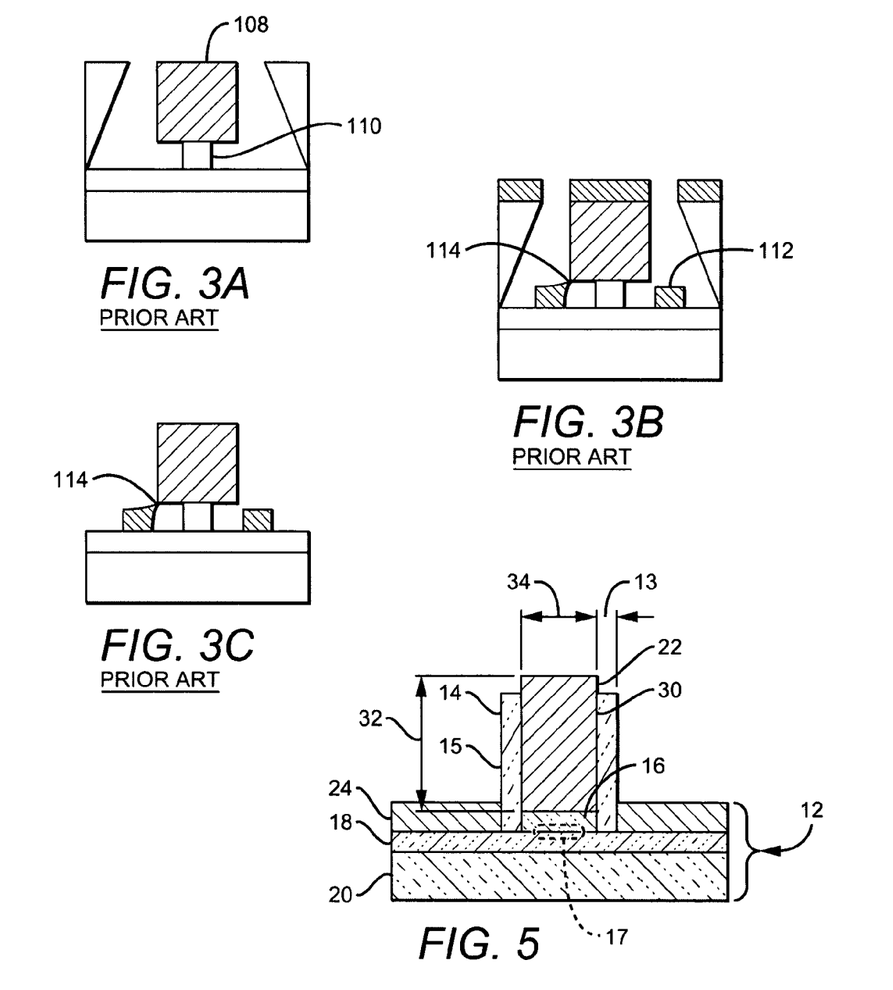
FIGS. 3a-3c are cross-sections depicting the formation of a prior art semiconductor device having a first contact like the undercut semiconductor contact of FIG. 2b and a second contact adjacent the first contact.
FIG. 5 is a cross-section of the emitter and base portions of the HBT of FIG. 4.

One standard approach to depositing a self-aligned base contact is to undercut the emitter semiconductor beneath the emitter contact using a wet chemical mesa etch to produce an undercut emitter contact 100, 108 as illustrated in FIG. 1b and FIG. 2c. As illustrated in FIGS. 3a-3b, the undercut emitter contact 108 is then used as a shadow mask during electron beam evaporation of the base contact 112. The line-of-sight nature of the evaporation process is supposed to prevent base-emitter short circuits. However, this process generally suffers from poor yield. The undercut of the emitter semiconductor 110 is difficult to control; as a result, the undercut emitter contact 108 may separate from the emitter semiconductor 110. Additionally, in order to avoid emitter-base short circuits 114 during deposition of the base contact, the thickness of the base contact must be less than the thickness of the emitter semiconductor 110. Even if this requirement is met, any stray metal strands inadvertently deposited during the liftoff process may cause a base-emitter short circuit.

SUMMARY OF THE INVENTION

Briefly, and in general terms, the invention is directed to various semiconductor structures and methods of forming such structures and semiconductor devices. In one aspect, the invention relates to a method of forming a submicron contact on a semiconductor structure. The method includes applying a mask layer to a surface of the semiconductor structure. The mask layer has a submicron width opening that exposes a portion of the surface, substantially planar sidewalls that are substantially perpendicular to the surface and a high aspect ratio. The method further includes establishing a conductive contact to the surface that conforms to the opening and removing the mask.

In another aspect, the invention relates to another method of forming a contact on semiconductor structure. This method includes applying a mask layer to a surface of the semiconductor structure. The mask layer has an opening that exposes a portion of the surface, substantially planar sidewalls that are substantially perpendicular to the surface and a high aspect ratio. The method also includes plating a conductive material to the exposed portion of the surface and removing the mask.

In another aspect, the invention relates to a semiconductor device that includes a layer of semiconductor material having a substantially planar surface and a conductive contact on the surface. The contact has a submicron dimension width, substantially planar sidewall surfaces that are substantially perpendicular to the surface, and a high aspect ratio.

In another aspect, the invention relates to a method of forming a second contact relative to a first contact on a first layer of a semiconductor structure that includes a second layer of semiconductor material. The first contact and first layer have sidewalls and the second layer has a surface. The method includes forming an insulating layer on the sidewalls of the first layer of semiconductor material and at least a portion of the sidewalls of the first contact. The method also includes applying a mask layer on the surface of the second layer of semiconductor material and forming an opening in the mask layer that exposes a portion of the surface of the second layer that is adjacent the insulating layer. The method further includes establishing the second contact by plating a conductive material to the exposed portion of the surface of the second layer.

In another aspect, the invention relates to a semiconductor device that includes a first layer of semiconductor material that has a top surface, sidewalls and a bottom surface and a first contact on the top surface. The contact has a width with a submicron dimension, substantially planar sidewalls that are substantially perpendicular to the top surface, and a high aspect ratio. The device further includes a second layer of semiconductor material that is adjacent the bottom surface of the first layer and an insulating material that covers all of the sidewalls of the first layer of semiconductor material and at least portions of the top surface of the second layer and the sidewalls of the first contact. The device further includes a second contact on the surface of the second layer that is positioned adjacent the first layer. The surface of the second layer includes a first material capable of having the second contact plated to it.

In another aspect, the invention relates to a method of forming a contact on a first layer of a semiconductor structure that includes a second layer adjacent the first layer. The method includes applying a mask layer on the surface of the first layer. The mask layer has an opening that exposes a portion of a surface of the first layer. The method also includes applying current to the second layer to electroplate a conductive material to the exposed portion of the surface of the first layer.

These and other aspects and advantages of the invention will become apparent from the following detailed description and the accompanying drawings which illustrate by way of example the features of the invention.

DETAILED DESCRIPTION OF THE PREFERRED EMBODIMENTS

Figure 4:
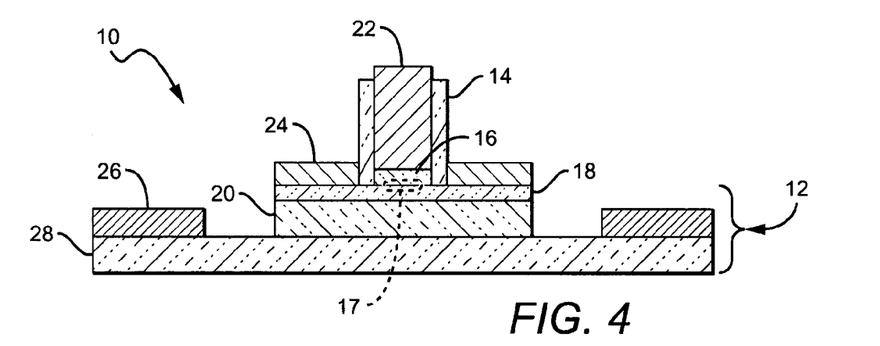
FIG. 4 is a cross-section of an HBT having a deep submicron emitter-base junction, self-aligned emitter and base contacts and a collector contact

Referring now to the drawings and particularly to FIG. 4, there is shown a bipolar junction transistor (BJT), specifically a heterojunction bipolar transistor (HBT) semiconductor device 10. The HBT device 10 includes a semiconductor structure 12 which in turn includes several layers of different n-type and p-type doped semiconductor materials. In one configuration of the semiconductor device 10, the semiconductor structure 12 is a Group III-V compound semiconductor structure that includes a second layer 18 of a p-type semiconductor material sandwiched between first and third layers 16, 20 of an n-type semiconductor materials. Examples of possible Group III-V semiconductor materials include Indium Phosphide (InP), Gallium Arsenide (GaAs), Gallium Nitride (GaN), Silicon Carbide (SiC) and Indium Arsenide (InAs) and InP-based, GaAs-based, GaN-based, SiC-based and InAs-based materials.

The device 10 also includes a first metal contact 22, a second metal contact 24 and a third metal contact 26. Each of the first, second and third metal contacts 22, 24, 26 is in electrical contact with a respective one of the layers of semiconductor material 16, 18, 20. Electrical contact between the third metal contact 26 and the third layer of semiconductor material 20 is through an additional, forth layer of semiconductor material 28. Positioned along the side of the first metal contact 22 and between the first metal contact and the second metal contact 24 is an insulating sidewall 14 that electrically isolates the two contacts from each other. The insulating sidewall 14 also functions as a spacer during the fabrication process that is used to self-align the second contact 24 to the junction 17 of the first layer of semiconductor material 16 and the second layer of semiconductor material 18.

Because the semiconductor device 10 shown in FIG. 4 is an HBT, the continuing detailed description identifies particular device features using nomenclature generally associated with HBTs. Thus, the first, second and third metal contacts 22, 24, 26 are referred to as the emitter, base and collector contacts, while the first, second and third layers of semiconductor material 16, 18, 20 are referred to as the emitter, base and collector layers. The junction 17 is referred to as the base-emitter junction.

With reference to FIG. 5, which further depicts the central, emitter-base portion of the semiconductor device of FIG. 4, the geometry of the emitter contact 22 is such that it has substantially straight sidewalls 30 and height 32 and width 34 dimensions at the submicron level. "Straight sidewalls" as used herein means a substantially planar surface that is substantially perpendicular to a top surface of the semiconductor structure 12. The top surface of the semiconductor structure 12 may be the top surface of either the emitter layer 16 or the base layer 18, each of which themselves are preferably substantially planar. "Planar" as used herein means a substantially flat surface having little or no surface irregularities. "Submicron" as used herein means dimensions less than 1 μm. The term "deep submicron" as used herein means dimensions less than 0.25 μm. The ratio of height to width, referred to as the "aspect ratio", of the emitter contact 22 may be anywhere between near 0 and approximately 10. In a preferred embodiment, the aspect ratio is a "high aspect ratio" of at least 2. In one exemplary configuration, the width dimension is 0.3 μm and the height dimension is 1.5 μm for an aspect ratio of 5. Width dimensions of less than 0.25 μm have also been demonstrated.

The geometry of the insulating sidewalls 14 is such that it has substantially straight sidewalls 15 and a width 13 preferably having a deep submicron dimension. The deep submicron width 13 of the sidewall 14 allows for close positioning of the emitter contact 22 and the base contact 24. In one process run, sidewalls 14 having widths of 0.1 μm were fabricated.

The submicron, and particularly the deep submicron, width dimension of the emitter contact 22 allows for lateral scaling of the emitter-base junction 17. This, in turn, extends the bandwidth and reduces the power consumption of the HBT. The high aspect ratio of the emitter contact 22 ensures the emitter contact 22 will be tall enough, e.g., at least approximately 1 μm tall to allow for process margin in the subsequent dielectric planarization and etchback process used to contact the base, emitter and collector contacts, with the first level of metal interconnects, which are used to ultimately connect the contacts to other devices and circuitry. During planarization and etchback, the tall emitter contact 22 allows for sufficient thickness of dielectric material to remain between the base contact and the emitter contact interconnect after etchback and thereby prevents the formation of a short circuit between the emitter contact and the base contact.

Figure 6A:
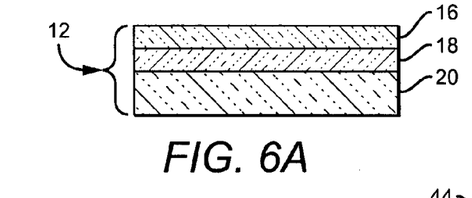
FIGS. 6a-6e are cross-sections depicting various stages of the formation a semiconductor device having a submicron emitter-base junction and an emitter contact with substantially straight sidewalls and a high aspect ratio.
Figure 6B:
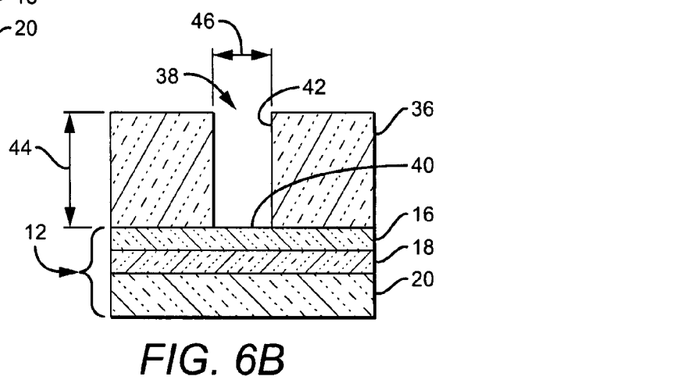

With reference to FIGS. 6a-6d, an exemplary process of forming an emitter contact 22 with the characteristics described above is illustrated. Initially, as shown in FIG. 6a, a semiconductor structure 12 having different layers of material that may function as an emitter layer 16, base layer 18 and collector layer 20 is obtained. Next, as illustrated in FIG. 6b, a layer of insulating material 36 is applied to the emitter layer 16 and patterned. The most common insulating mask is photoresist, a polymer that is coated on the wafer and patterned using well known techniques, such as optical or electron-beam lithography.

The photoresist layer 36 includes an opening 38 having a geometry that ultimately defines the dimensions of the emitter contact. This geometry is created using standard photoresist processes and provides an opening 38 that has substantially straight sidewalls 42 and height 44 and width 46 dimensions at the submicron level with an aspect ratio of up to approximately 10. The opening 38 also exposes a portion 40 of the emitter layer 16 to the environment.

As an optional step (not shown) in the process of forming the emitter contact 22, a thin layer of dielectric material may be deposited on the emitter layer 16 prior to depositing the photoresist 36. The dielectric material may provide better adhesion of the photoresist material 36. Examples of such a dielectric material include Silicon Nitride ($Si_xN_y$), Silicon Dioxide ($SiO_2$), and Silicon Oxynitride (SiON). The dielectric material may also act as an anti-reflective coating in optical or electron-beam lithography processes and improve dimensional control of the photoresist opening. If this optional step is performed, the portion of the dielectric material exposed by the opening 38 is etched away after the photoresist is patterned and opened. While some amount of photoresist 36 may be etched away during the dielectric etch, because the photoresist is thicker than the dielectric layer, the amount of photoresist removed is insubstantial.

Figure 6C:
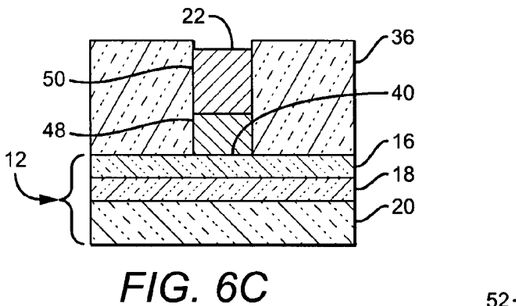
Figure 6D:
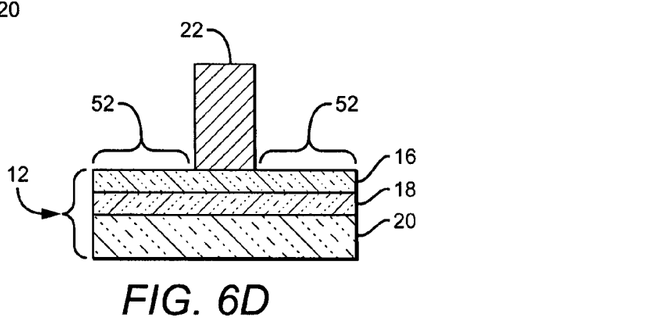

With reference to FIG. 6c, after the photoresist is applied, the emitter contact 22 is formed using well known plating techniques. "Plating" as used herein refers to both electroplating and electroless plating processes that are used to deposit metal films. During an electroplating process, the semiconductor structure 12 with photoresist 36 is submerged in a liquid bath that includes ions of the metal that will form the contact. An external power supply is used to apply a potential between an electrode in the liquid bath and the emitter layer 16. The electrode, known as the anode, may be made of a consumable source of the same metal ions that are in solution, or of a noble metal, such as platinum, that is not consumed but catalyzes an oxidation reaction at its surface. The applied potential drives a reduction reaction of the metal ions at the exposed portion 40 of the emitter layer 16. An electrical current forced by the external supply passes through the emitter layer and supplies electrons for the reduction reaction at the exposed portion 40 of the emitter layer. Over time, electroplated metal forms the emitter contact 22. In an electroless plating process the deposition of the metal film is not controlled by an external power supply, but rather the deposition is initiated by a chemical reduction reaction that is catalyzed by the metal that is being deposited. In either plating process, the shape of the emitter contact 22 conforms to the opening 38 defined by the photoresist 36.

In one configuration, a single bath solution is used to form an emitter contact 22 of a single material type. Metals that could be used as an electroplated contact include but are not limited to gold (Au), platinum (Pt), rhodium (Rh), palladium (Pd), copper (Cu), Nickel (Ni), or silver (Ag) or any Au, Pt, Rh, Pd, Cu, Ni or Ag-based material. The selection of the metal that is plated may depend on the desired electrical, mechanical and thermal properties of the contact. For example, certain metals such as members of the platinum group are known to form interfaces with semiconductor layers that have very low specific contact resistances. "Platinum group" as used herein refers to the group of metals classified as the platinum group. This group includes: platinum (Pt), palladium (Pd), rhodium (Rh), ruthenium (Ru), Osmium (Os) and Iridium (Ir). Other metals, such as gold, may have less mechanical stress in deposited films and that allows for thicker deposits of the metal to be deposited before adverse effects such as loss of adhesion to the semiconductor occur.

In alternate configurations, different plating solutions may be used to form a plated metal-stack emitter contact 22 having several layers of different metals, each with different beneficial properties. The use of a multi-metal stack may permit more flexibility in tailoring the desired electrical, mechanical and thermal properties of the contact. For example, the use of a thick (~1 μm) gold layer in a tall emitter contact is desirable because of its high conductivity and low mechanical stress.

However, gold atoms are known to rapidly diffuse through semiconductor layers at elevated temperatures encountered at later process steps or in device operation. Diffusion of gold is undesirable because if gold atoms penetrate through the emitter layer into the base layer a base-emitter short circuit occurs. Several metals, such as platinum or palladium, act as diffusion barriers to gold atoms. However, these metals may have a lower conductivity or a higher mechanical stress than gold. A two layer emitter contact consisting of a thin, approximately 300-1000 Angstrom, first layer 48 of a platinum group metal, such as platinum or palladium, and a thicker, approximately 10,0000 Angstrom, second layer 50 of gold would achieve the desired electrical, mechanical and thermal properties for the emitter contact. Further, it may be beneficial to add yet another metal layer on top of the Au layer. For example, Au is known to sputter and redeposit in some dry etch processes that maybe used in later process steps when the emitter contact is exposed. Nickel (Ni) is commonly used as hard mask during such dry etch processes. Therefore, it may be beneficial to add a Ni layer on top of the Au to protect the contact during dry etch processes.

Figure 6E:
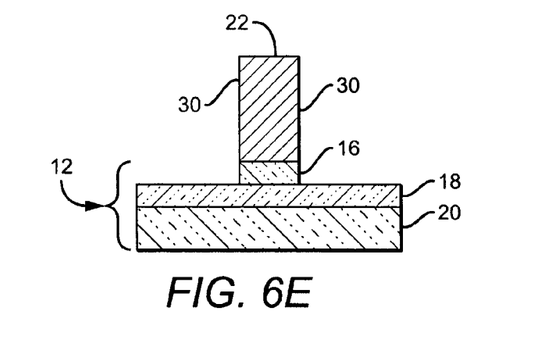

After plating the emitter contact 22, the photoresist 36 and remaining dielectric layers, if any, are removed using known techniques. For example, the photoresist 36 may be removed using a solvent soak or reactive ion etch (RIE) and the dielectric layer may be removed using a RIE or an inductively coupled plasma (ICP) etch. The end result is a semiconductor structure 12 with an emitter contact 22 as shown in FIG. 6e.

Next, the portion 52 of the emitter layer 16 exposed by the removal of the photoresist 36 (FIG. 6c) is removed. This removal may be done using known wet chemical etching processes or any one of several known anisotropic etching techniques, such as a RIE or ICP etch, or a combination of chemical and anisotropic techniques. A dry chemical etch may be used depending on the type of material forming the emitter layer 16. Anisotropic etching may be preferred in view of its directional dependent etching effects, which are explained in detail below with respect to base contact formation. The structure remaining after this etching process is illustrated in FIG. 6a.

Due to the geometry and dimensions of the photoresist openings 38, the emitter contact 22 formed by the electroplating process has substantially straight sidewalls 30 and a large aspect ratio. As previously stated, contacts with aspect ratios of 5, i.e., 0.3 μm wide and 1.5 μm high, have been formed using this process and deep submicron widths of less than 0.25 μm have also been demonstrated.

Figure 7A:
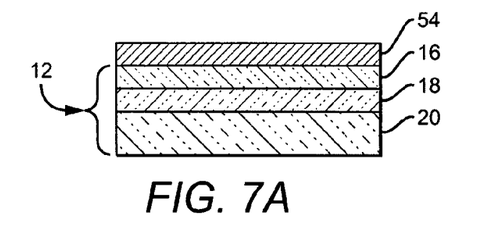
FIGS. 7a-7e are cross-sections depicting various stages of an alternate formation of a semiconductor device having a submicron emitter-base junction and an emitter contact with substantially straight sidewalls and a high aspect ratio.

With reference to FIGS. 7a-7d, another process of forming an emitter contact with the submicron and large aspect ratio characteristics described above is illustrated. Initially, as shown in FIG. 7a, a semiconductor structure 12 having different layers of material that may function as an emitter layer 16, base layer 18 and collector layer 20 is obtained and a metal-plating base, or seed layer 54 is deposited on the emitter layer 16 using any of several known methods such as electron beam evaporation or sputter deposition. The seed layer 54 preferably has a substantially planar top surface.

The addition of a plating seed layer 54 is beneficial in that it may add a lower resistance metal in parallel with the emitter layer 16. These layers 16 and 54 conduct current in an electroplating process and resistive voltage drops in these layers lead to non-uniformity in the plating process. A lower resistance path for the current will lead to lower voltage drops and improved uniformity.

The use of a plating seed layer 54 also allows more options in selecting metals for the contact. Certain metals either cannot or are extremely difficult to deposit in plating processes. However, these metals may be readily deposited by other methods such as electron beam evaporation or sputter deposition. Examples of such metals include but are not limited to tungsten (W), titanium (Ti), and titanium tungsten alloys (TiW). Using such metals in the plating seed layer allows further flexibility in achieving the desired electrical, mechanical and thermal properties of the contact. In one embodiment, the seed layer 54 includes layers of Ti/TiW/Au, with Au being the top most layer.

Tungsten and TiW are refractory metals (very high melting temperatures); therefore, they tend to be thermally stable and do not diffuse into the semiconductor. They also act as diffusion barriers between the Au and the semiconductor. Ti is also useful for providing a low resistance contact to the semiconductor. It tends to react with the semiconductor at the surface but does not diffuse like Au. The Au in the seed layer 54 stack is used to initiate the plating process because the adhesion of plated Au to W or TiW surfaces tends to be poor. Exemplary thicknesses for the metal seed layer 54 stack are Ti (100 Angstroms)/TiW (250 Angstroms)/Au (200 Angstroms).

Figure 7B:
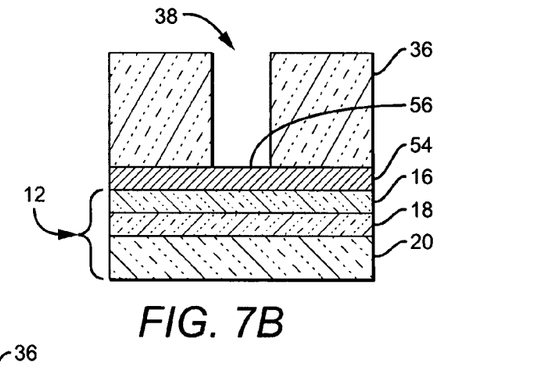
Figure 7C:
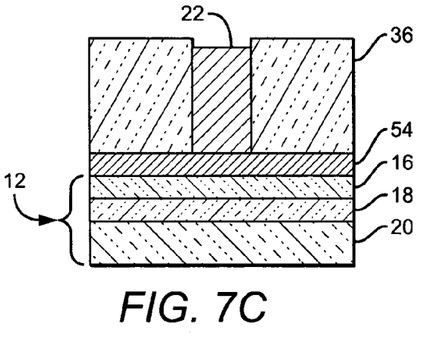
Figure 7D:
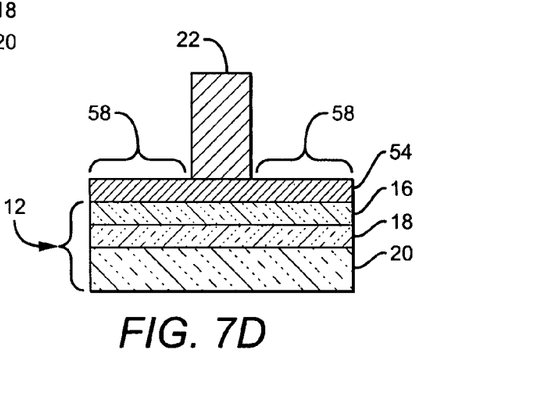

Next, as illustrated in FIGS. 7b, 7c and 7d respectively, a photoresist 36 is applied, an emitter contact 22 is electroplated to the portion 56 of the seed layer 54 exposed by opening 38 in the photoresist 36 and the photoresist is removed. Each of these processes is performed in the same manner as described above with reference to FIGS. 6b, 6c and 6d.

Figure 7E:
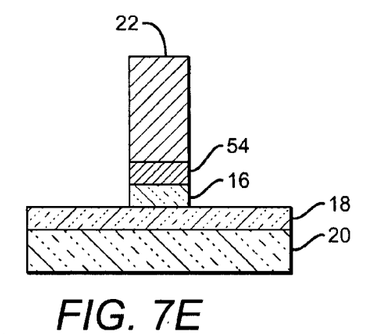

Next, the portions 58 of the seed layer 54 exposed by the removal of the photoresist, and the coincident portions of the emitter layer 16 underlying the exposed portions 58 of the seed layer are removed. This removal may be done using a wet chemical etch or any one of several known anisotropic etching techniques, such as a reactive ion etch (RIE) or inductively coupled plasma (ICP), or a combination of chemical and anisotropic techniques. The end result is the semiconductor structure shown in FIG. 7e.

After formation of the emitter contact 22, the next step in the HBT fabrication process is the formation of the insulating sidewall 14. As illustrated in FIG. 4, the insulating sidewall 14 electrically isolates the emitter contact 22 from the base contact 24. The insulating sidewall 14 also passivates the sidewalls of the emitter layer 16 and the exposed portions, e.g., perimeter, of the base-emitter junction 17. The insulating sidewall 14 may be formed of one or more insulating/dielectric materials that may be isotropically coated and then anisotropically etched. Examples of such materials include Silicon Nitride ($Si_xN_y$), Silicon Dioxide ($SiO_2$), Silicon Oxynitride (SiON), Aluminum Nitride (AlN) and Silicon Carbide (SiC).

Figure 8A:
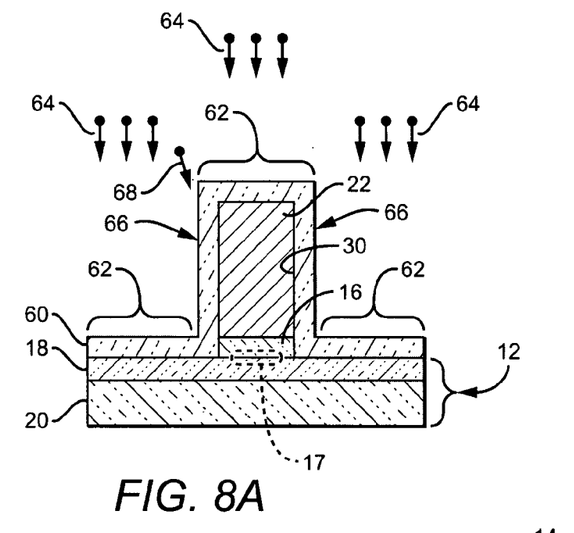
FIGS. 8a and 8b are cross-sections depicting various stages of the formation of insulating sidewalls adjacent the emitter contact and the emitter layer of semiconductor material.

As shown in FIG. 8a, the first step in the insulating sidewall formation process involves a conformal deposition of a dielectric film 60 over the exposed portions of the emitter contact 22, the emitter layer 16 and the base layer 18. The dielectric film 60 is formed of one or more layers of dielectric materials and may be deposited using well know techniques, such as a plasma enhanced chemical vapor deposition (PECVD) system, or by some other well known means that provides isotropic film coverage, such as sputtering.

With continued reference to FIG. 8a, after the dielectric film 60 is deposited, the film is etched using an anisotropic etch process; such as a reactive ion etch (RIE) or inductively coupled plasma (ICP) etch. Anisotropic etching processes are well known in the art and are therefore not explained in detail. In general, however, such processes are characterized by relatively low pressure and high ion bombardment energies in, what is for the most part, a single direction.

As illustrated in FIG. 8a, the semiconductor structure 12 with emitter contact 22 may be placed within an anisotropic etching apparatus such that the portions 62 of the dielectric film 60 to be removed, i.e., the portions that cover the base layer 18 and the top of the emitter contact 22, are positioned normal to the generally single direction of the ions 64, while those portions 66 of the dielectric film 60 to remain, i.e., the portions that cover the emitter contact sidewalls 30, are positioned parallel to the direction of the ions. While some ions 68 may diverge from the normal direction and impact the sidewall surfaces 66 of the dielectric film at an angle, the etching affect of these ions is generally negligible compared to the affect of ions 64 that impact normal to a surface.

Figure 8B:
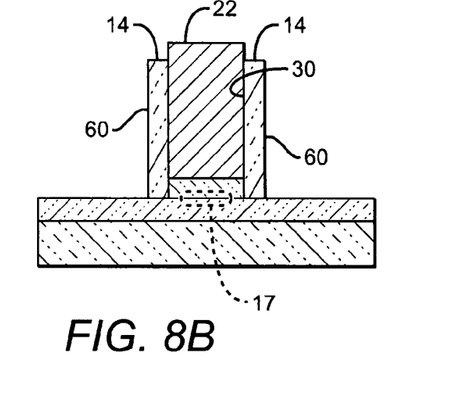

As shown in FIG. 8b, upon completion of the anisotropic etching process, the only portions of the dielectric film 60 remaining are those which cover the emitter contact sidewalls 30. The portions function as the insulating sidewall 14 that isolates the emitter contact 22 from the base contacts. The sidewall also functions as a spacer to self-align the base contact with the base-emitter junction 17.

Figure 9A:
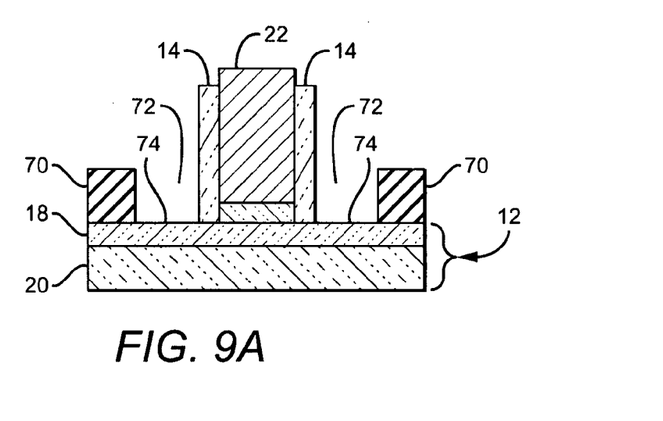
FIGS. 9a and 9b are cross-sections depicting various stages of a plating process of forming base contacts that are self-aligned with respect to the emitter contact.
Figure 9B:
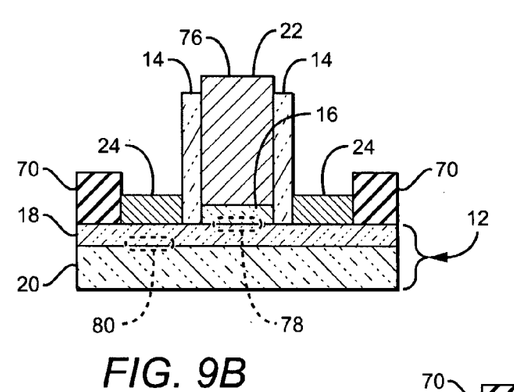

With reference to FIGS. 9a and 9b, after forming the sidewall 14, the base contact is formed using a plating technique. As illustrated in FIG. 9a during deposition of the base contact metal, the initial step in base contact formation involves the creation of a insulating mask layer 70 with openings 72 that define the general geometry of the base contact. The most common insulating mask layer is photoresist, a polymer that is coated on the wafer and patterned using well known techniques such as optical or electron-beam lithography. The openings 72 expose portions 74 of the base layer 18 upon which the base contact metal will be deposited using a plating process.

With reference to FIG. 9b, the base contact 24 is formed by a plating process similar to the processes described above with respect to the formation of the emitter contact 22. In an electroplating process, electrons must be supplied at the exposed surface of the base layer 18. Current is supplied from an external power supply. The path of the current from the external power supply to the exposed base layer 18 may be through the base layer or through other layers such as the emitter layer 16 or the collector layer 20. The base layer 18 generally has a high sheet resistance that is greater than 500 Ohms per square. If the external supply is connected directly to this layer, resistive voltage drops in the layer result in an uneven potential distributed across a wafer. This may result in the thickness of the deposited base contact 24 varying across a wafer. The emitter 16 and collector 20 layers generally have lower resistance than the base layer 18. If plating current is passed through these layers, a more even potential can be achieved across a wafer resulting in improved thickness uniformity of the base contact 24. If the emitter layer is to be used to conduct the current, the process flow described above must be modified such that the emitter layer is not removed from the areas that surround the exposed portions 74 of the base layer 18. Accordingly, in a preferred process, the external supply is connected to the collector layer 20. This process requires no changes to the process flow described above.

Also, similar to the emitter contact 22, the base contact 24 may be formed of a single metal, such as gold or platinum, or may be a stacked multi-metal contact with metals selected to achieve desired electrical, mechanical and thermal properties. For example a metal stack having a layer of high work function, thermally stable material, such as a platinum or platinum-group based material in direct contact with the base layer 18 and a layer of low resistance, low stress material, such as a gold or gold-based material on top of the platinum based material layer. As with the emitter contact, the layer of material in direct contact with the base layer 18 acts as a diffusion barrier to prevent the migration of gold into the semiconductor structure 12. In a preferred embodiment, the base contact 24 is formed of only platinum or a member of the platinum group metal family.

During formation of the base contact 24, the insulating sidewalls 14 isolate the sides of the emitter contact 22 and the emitter layer 16 from the plating bath. During the plating process, base contact metal is deposited only where there is electrical contact with the plating solution. Accordingly, metal is deposited on the exposed portions 74 (FIG. 9a) of the base layer 18, but not on the nonconductive insulating sidewalls 14 or the insulating mask 70.

Regarding the exposed top surface 76 of the emitter contact 22, during electroplating, the base layer 18 and the emitter layer 16 beneath the emitter contact 22 may be charged such that the junction 78 of the layers presents a reverse biased diode with respect to the potential applied by the external supply. For example, if the emitter layer 16 is an n-type semiconductor and the base layer 20 is a p-type semiconductor applying a negative potential to the base layer 20 results in the base-emitter junction 78 being reverse biased. The reverse biased junction presents a high impedance for current flow through the junction. Flow of current through this junction is necessary to deposit metal on the exposed portion of the emitter contact 22. No such junction prevents current from reaching the exposed portion 74 base layer. Therefore, when plating, metal will deposit on the exposed portion 74 of the base layer and will not deposit at all or will deposit at a much lower rate on the exposed emitter contact 22.

When using the underlying collector layer to carry plating current from the external supply, a p-n junction is also present at the base-collector junction 80. At this junction, a negative potential applied to the collector by the external supply will forward bias the diode and present a low impedance to current flow. Therefore, current will be able to flow to the exposed portion 74 of the base layer and plating of the base contact 24 can occur.

The foregoing electroplating process is "selective" in that the only base contact metal deposition that occurs during electroplating is that which is necessary to form the base contact 24. The electroplating process does not damage or remove any portion of the insulating sidewall 14. Thus, the base contact 24 may be deposited around the emitter contact 22 without concern over creating a short circuit between the two contacts. The selective electroplating process is beneficial in that it requires less consumption of precious metals and may require fewer process steps resulting in lower production costs, reduced production time, and increased flexibility in the process.

In an alternate configuration (not shown), the base contact metal may be plated onto a metal-plating base, or seed layer that is deposited on the base layer. This layer of plating material may be similar to the seed layer 54 (FIGS. 7a-7d) described above and is deposited prior to the plating process using known techniques such as electron beam evaporation or sputter deposition. The use of a layer of plating material may be desirable because it provides a low resistance path for the plating current that could improve the across wafer uniformity of the plated metal. The initially deposited metal may also have electrical, mechanical or thermal characteristics that cannot be obtained through an electroplated metal. To prevent a base-emitter short circuit the seed layer must not form a continuous layer between the exposed emitter contact 22 and the exposed portion of the base layer 74. A non-continuous seed layer could be obtained using a self-aligned liftoff of a very thin metal layer, or by using a blanket metal deposition process that is followed by a planarization and etchback process that removes the metal from the top and sidewalls of the emitter contact 22.

Figure 10A:
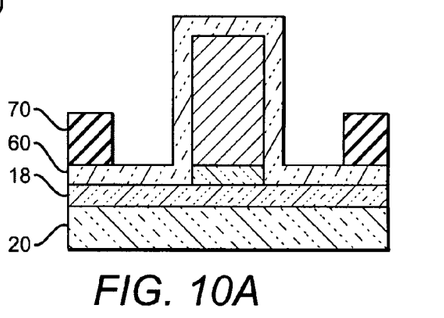
FIGS. 10a and 10b are cross-sections depicting various stages of an alternate plating process of forming base contacts that are self-aligned with respect to the emitter contact.
Figure 10B:
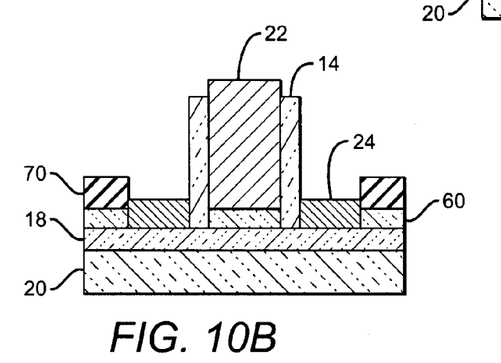

In another alternate configuration, as illustrated in FIG. 10a, the photoresist 70 is applied prior to etching the layer of dielectric material 60. The dielectric layer 60 is then anisotropically etched as previously described. Next, as shown in FIG. 10b, the base contact metal is electroplated to the base layer 18 using the remaining photoresist 70 and underlying portion of the dielectric layer 60 as the base contact 24 mask.

Figure 11A:
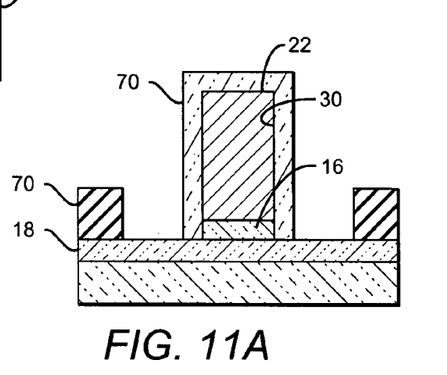
FIGS. 11a and 11b are cross-sections depicting various stages of an alternate plating process of forming base contacts that are non-self-aligned with respect to the emitter contact.
Figure 11B:
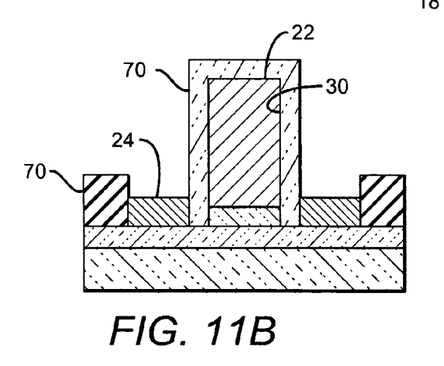

In yet another configuration, as illustrated in FIGS. 11a and 11b, the base contact could be deposited in a non-self aligned fashion. In this case, insulating sidewalls 14 (FIG. 9a) would not be required to isolate the emitter contact 22 and emitter semiconductor 16 from the base contact 24. Instead, as shown in FIG. 11a, the insulating mask 70 used to pattern the base layer 18 is patterned so that the emitter contact 22 and emitter sidewalls 30 are also covered by the mask. As shown in FIG. 11b, during plating of the base contact 24, these surfaces 22, 30 are not exposed to the plating solution. In this configuration, the base contact 24 to emitter contact 22 spacing is determined by the patterned dimensions of the insulating mask 70.

After deposition of the base contact, the HBT process proceeds like that of a standard HBT. Remaining process steps are well known in the art and are not described in detail. These process steps include: base contact post deposition, base mesa isolation, collector contact and post definition, device isolation, device passivation and interconnect formation.

Using one or more of the above-described processes, InP HBTs with deep submicron emitter-base junction dimensions and self-aligned base Ohmic contacts have been fabricated. For example, HBTs with emitter junction widths scaled to 0.25 μm have been fabricated. These devices demonstrated peak $f_\tau$ and $f_{max}$ values of over 300 GHz.

Figure 12:
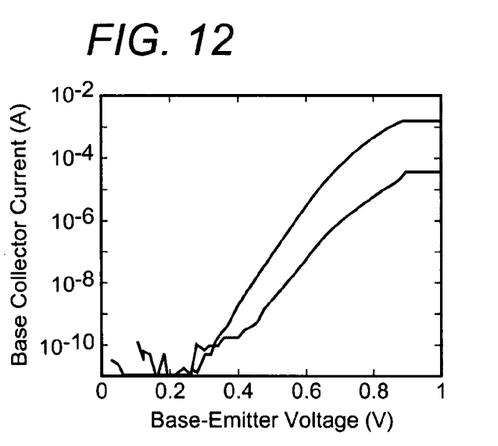
FIG. 12 is a graph of the Gummel characteristics of a submicron HBT fabricated using one or more of the processes of the invention.
Figure 13:
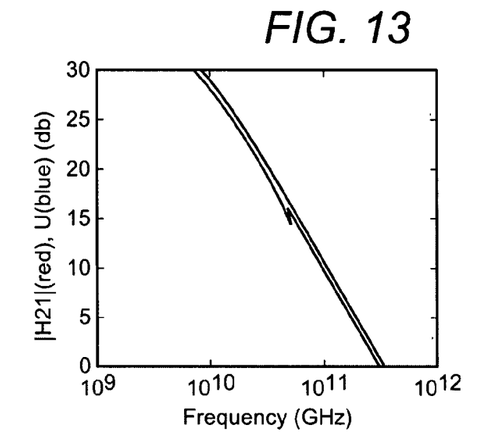
FIG. 13 is a graph of the unilateral power gain and short circuit gain for a submicron HBT fabricated using one or more of the processes of the invention.
Figure 14:
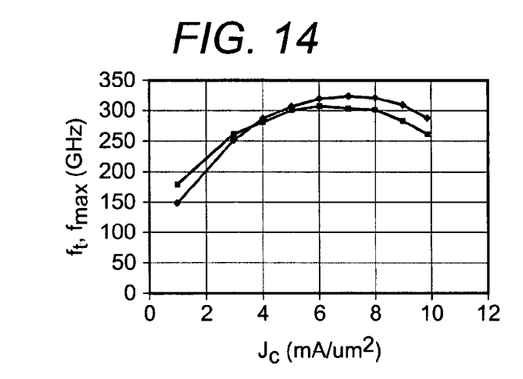
FIG. 14 is a graph of transistor $f_\tau$ and $f_{max}$ plotted versus current density for a submicron HBT fabricated using one or more of the processes of the invention.
Figure 15:
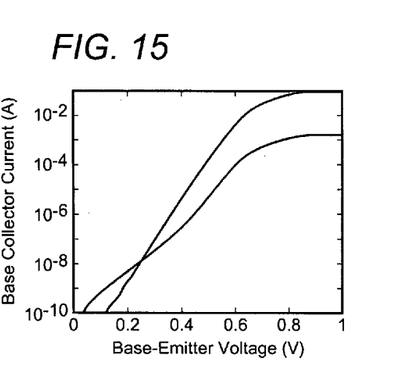
FIG. 15 is a graph of the Gummel characteristics of a test structure of 1000 parallel submicron HBTs fabricated using one or more of the processes of the invention.

Gummel characteristics of 0.25×10.0 μm² HBT are illustrated in FIG. 12. Devices demonstrated a transistor current gain β of approximately 60, and a common emitter breakdown voltage $BV_{CEO}$ greater than 4.5 V. High frequency S-parameter measurements of the transistor were made from 1-50 GHz. FIG. 13 shows the unilateral power gain (U) and short circuit current gain ($h_{21}$) for the HBT of FIG. 12. The device bias conditions are an emitter current density $J_E$=7 mA/μm² and a collector-base voltage $V_{CB}$=0.4V. Extrapolations of $h_{21}$ and U at −20 dB/decade predict a current gain cutoff frequency ($f_\tau$) and maximum frequency of oscillation ($f_{max}$) of 325 GHz and 305 GHz, respectively. FIG. 14 shows the transistor $f_\tau$ and $f_{max}$ plotted versus current density. The transistor is found to sustain high current density operation at low collector-base operating voltages, an important characteristic for transistors in high speed logic circuits. The extracted collector base capacitance of the device is a low 9.5 fF. In addition, to demonstrating impressive RF performance deep submicron devices have also been realized with high levels of integration. FIG. 15 shows the Gummel characteristics of a test structure with 1000 parallel submicron HBTs.

Figure 16:
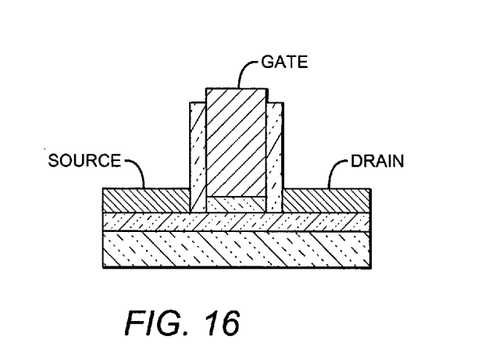
FIG. 16 is a cross-section of a submicron field effect transistor (FETS) or high electron beam mobility transistor (HEMT)
Figure 17:
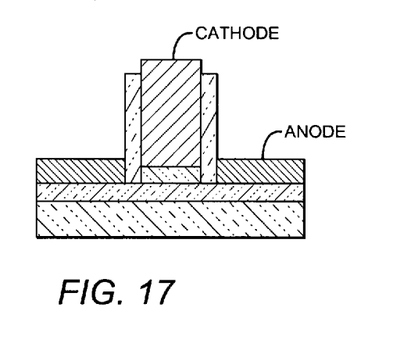
FIG. 17 is a cross-section of a submicron Schottky diode.

While the foregoing description has focused on the formation of emitter and base contacts in an HBT semiconductor device, the invention is equally application to various other semiconductor devices. With reference to FIGS. 16 and 17, these devices include, field effect transistors (FETS), high electron beam mobility transistors (HEMT) and Schottky diodes. In some of these devices, the choice of contact metal may vary from those described with respect to the HBT. For example, in HEMTs it is generally desirable for the contacts to be formed of a metal that diffuses into the underlying semiconductor layer during temperature cycling.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A method of forming a submicron contact on a semiconductor structure, said method comprising:
    applying a mask layer to a first surface of the semiconductor structure, the mask layer having a greater height than width and a submicron width opening exposing a portion of the surface, substantially planar sidewalls that are substantially perpendicular to the surface;
    establishing a conductive contact to the first surface that conforms to the opening;
    removing the mask; and
    selectively depositing a conductive material on a second surface of said semiconductor structure, said semiconductor structure under said first surface comprising a reverse diode with respect to said plating energy to prevent deposition of said conductive material on said first contact.

2. The method of claim 1 wherein the contact is established by depositing at least one layer of conductive material in the opening.

3. The method of claim 2 wherein the conductive material is deposited by plating a single material to the exposed portion of the surface.

4. The method of claim 3 wherein the single material comprises at least one of gold, a gold-based material, a platinum group metal, a platinum group based material, silver, a silver-based material, nickel, a nickel-based material, copper and a copper-based material.

5. The method of claim 2 wherein the conductive material is deposited by:
    plating a first material to the exposed portion of the top surface to form a layer of first material; and
    plating a second material to the layer of first material to form a layer of second material.

6. The method of claim 5 wherein the first material is a platinum group metal or platinum group metal-based.

7. The method of claim 5 wherein the second material is gold or gold-based.

8. The method of claim 5 further comprising plating a third material to the layer of the second material to form a layer of third material.

9. The method of claim 8 wherein the third material is nickel or nickel-based.

10. The method of claim 1 further comprising:
    depositing a layer of dielectric material on the surface of semiconductor material prior to applying the mask layer; and
    removing the portions of the dielectric material exposed by the opening prior to establishing the conductive contact.

11. The method of claim 1 wherein the surface of the semiconductor structure comprises a layer of semiconductor material.

12. The method of claim 1 wherein the semiconductor structure comprises a layer of semiconductor material and further comprising:
    depositing a seed layer of conductive material on the layer of semiconductor material, wherein the surface of the semiconductor structure comprises the seed layer; and
    removing the exposed portions of the seed layer not covered by the conductive contact after removing the mask.

13. The method of claim 12 wherein the seed layer is deposited by:
  depositing a first layer of a first material on the surface; and
  depositing a second layer of a second material on the first layer.

14. The method of claim 13 wherein the first material comprises at least one of titanium (Ti), tungsten (W) and titanium tungsten (TiW).

15. The method of claim 13 wherein the second material comprises gold or a gold-based material.

16. The method of claim 13 wherein the first layer of material comprises two layers of materials.

17. The method of claim 16 wherein each of the two layers of materials comprises at least one of titanium (Ti), tungsten (W) and titanium tungsten (TiW).

18. A method of forming a contact on semiconductor structure, said method comprising:
  applying a mask layer to a surface of the semiconductor structure, the mask layer having a greater height than width and an opening exposing a portion of the surface, said opening having substantially planar sidewalls that are substantially perpendicular to the surface;
  plating a conductive material to the exposed portion of the surface to form said contact with substantially planar sidewalls that are substantially perpendicular to the surface; and
  removing the mask, wherein said contact comprises an emitter contact and said semiconductor structure comprises a bipolar transistor.

19. The method of claim 18 wherein the surface of the semiconductor structure comprises a layer of semiconductor material.

20. The method of claim 18 wherein the semiconductor structure comprises a layer of semiconductor material and further comprising:
  depositing a seed layer of conductive material on the layer of semiconductor material, wherein the surface of the semiconductor structure comprises the seed layer; and
  removing the exposed portions of the seed layer not covered by the conductive contact after removing the mask.

21. A method of forming a second contact relative to a first contact comprising:
  arranging the first contact on a first layer of a multiple layer semiconductor material, the first contact and the first layer having sidewalls;
  forming an insulating layer on at least a portion of the sidewalls of the first layer of semiconductor material;
  applying a mask layer on a surface of a second layer of said multiple layer semiconductor material;
  forming an opening in the mask layer exposing a portion of said second layer surface that is adjacent the insulating layer; and
  selectively depositing a conductive material on the exposed portion of said second layer surface by plating, said semiconductor material under said first contact preventing the flow of plating current to said first contact to prevent the deposition of conductive material on said first contact.

22. The method of claim 21 wherein the conductive material is plated only to the exposed portion of said second layer surface.

23. The method of claim 21 wherein the semiconductor structure includes a third layer of said multiple layer semiconductor material, said third layer adjacent the second layer and the conductive material being plated to the second surface by applying current to the third layer of semiconductor material.

24. The method of claim 23 wherein the second layer has a higher resistance than the third layer.

25. The method of claim 21 wherein the conductive material comprises a single material type.

26. The method of claim 25 wherein the single material comprises at least one of gold, a gold-based material, a platinum group metal, a platinum group based material, silver, a silver-based material, nickel, a nickel-based material, copper and a copper-based material.

27. The method of claim 21 wherein plating comprises:
  plating a first material to the exposed portion of the surface to form a layer of first material; and
  plating a second material to the layer of first material to form a layer of second material.

28. The method of claim 27 wherein the first material is a platinum group metal or platinum group metal-based.

29. The method of claim 27 wherein the second material comprises gold or a gold-based material.

30. The method of claim 21 further comprising:
  depositing a layer of insulating material on said second layer surface prior to applying the mask layer; and
  removing the portions of the insulating material exposed by the opening prior to plating.

31. The method of claim 21 wherein the mask layer applied on the sidewalls of the first layer and on the first contact is the same mask applied on the surface.

32. The method of claim 21 wherein the sidewalls of the first layer and the sidewalls of the first contact extend substantially perpendicular with respect to the surface of the second layer and forming an insulating layer comprises:
  isotropically applying a dielectric coating on the sidewalls of the first layer, on the first contact and on the surface; and
  anisotropically removing the dielectric coating from the surface.

33. The method of claim 21 further comprising applying a seed layer on the second layer prior to applying the mask layer, the seed layer functioning as the surface of the second layer.

34. The method of claim 21 wherein the insulating layer is formed on all of the sidewalls of the first layer of semiconductor material and at least a portion of the sidewalls of the first contact.

35. A method of forming a contacts on surfaces of semiconductor material, comprising:
  providing a semiconductor structure that includes a second layer adjacent the first layer, and a third layer adjacent to a said second layer:
  applying a mask layer on the surface of the first layer, the mask layer having a greater height than width and having an opening exposing a portion of a surface of the first layer;
  applying a first current to the second layer to electroplate a first conductive material to the exposed portion of the surface of the first layer; and
  applying a second current to said third layer to electroplate a second conductive material to the exposed portion of the surface of said second layer, said semiconductor structure under said first conductive material blocking said second current layer from passing to said first conductive material.

36. The method of claim 35 wherein the first layer has a higher resistance than the second layer.

37. The method of claim 35, wherein said semiconductor structure under said first conductive material comprises a reverse diode with respect to said second current.

* * * * *